United States Patent [19]
Rhoades et al.

[11] Patent Number: 5,728,507
[45] Date of Patent: Mar. 17, 1998

[54] METHOD FOR PLANARIZING A SEMICONDUCTOR LAYER

[75] Inventors: Robert L. Rhoades; George R. Campbell; Steven D. Frezon; Mark D. Hall, all of Austin, Tex.

[73] Assignee: Motorola, Inc., Schaumburg, Ill.

[21] Appl. No.: 603,797

[22] Filed: Feb. 20, 1996

[51] Int. Cl.$^6$ .................................................. G03C 5/00
[52] U.S. Cl. ..................... 430/313; 156/645.1; 216/38; 438/692; 438/697; 438/699; 438/703; 438/759; 438/761
[58] Field of Search ................. 156/645.1; 216/38; 430/313; 438/759, 761, 692, 703, 697, 699

[56] References Cited

U.S. PATENT DOCUMENTS

| | | | |
|---|---|---|---|
| 5,627,110 | 5/1997 | Lee et al. | 438/692 |
| 5,629,242 | 5/1997 | Nagashima et al. | 437/235 |

OTHER PUBLICATIONS

J. Warnock; "A Two-Dimensional process Model for Chemimechanical Polish Planarization;". J. Electrochem. Soc.; vol. 138, No. 8, pp. 2398–2402 (Aug. 1991).

S. Sivaram, et al.; "Planarizing Interlevel Dielectrics by Chemical-Mechanical Polishing;" Solid State Technology, pp. 87–91 (May 1992).

*Primary Examiner*—Mark Chapman

[57] ABSTRACT

A moat pattern (19) is formed in a first layer of material (11) to improve the profile of a planarization process. The presence of the moat pattern (19) in the periphery of a semiconductor substrate (10.30) moves the effects of the relaxation distance (13) away from the critical areas of the semiconductor substrate (30). The moat pattern (19) is formed during a photolithographic process by using a photolithographic mask (20) that has a portion (22) that defines and patterns the moat pattern (19). The moat pattern (19) is defined as edge dice (31) are patterned across the semiconductor substrate (30).

8 Claims, 2 Drawing Sheets

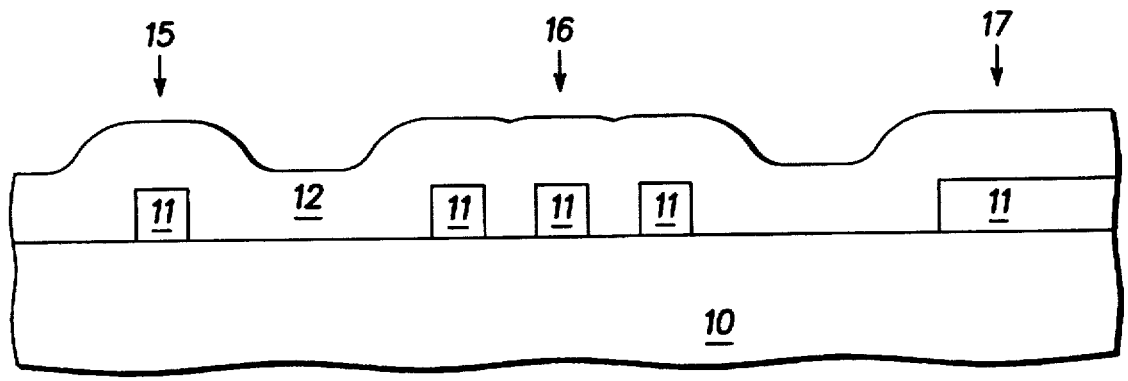
FIG. 1 - PRIOR ART -
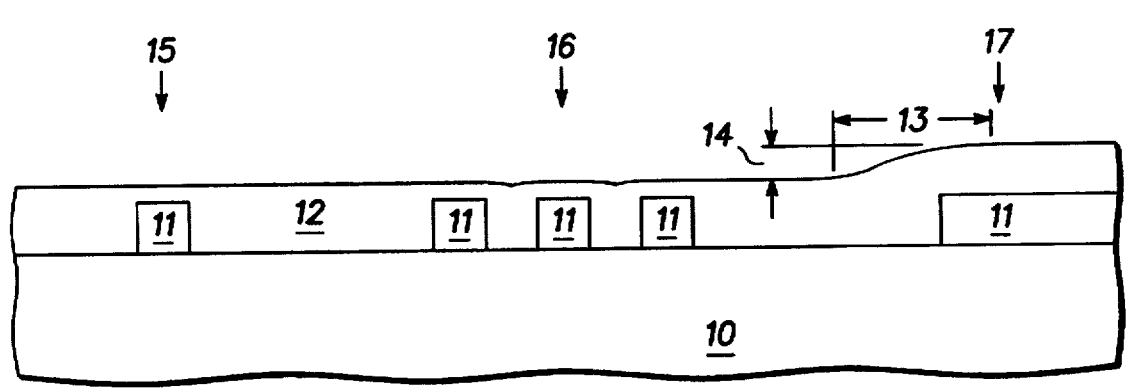
FIG. 2 - PRIOR ART -
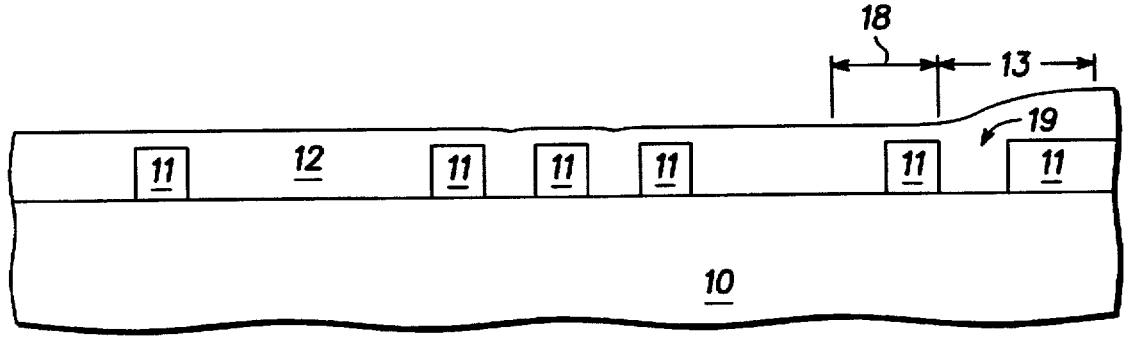
FIG. 3

METHOD FOR PLANARIZING A SEMICONDUCTOR LAYER

BACKGROUND OF THE INVENTION

This invention relates, in general, to semiconductor devices, and more particularly, to methods of planarizing layers used in semiconductor processing.

In semiconductor manufacturing, the pace of technological advancements requires that the cost of new semiconductor devices be reduced, yet at the same time, the performance of the semiconductor device must be improved. These requirements are what push semiconductor devices to decreasing device geometries. As the geometries of semiconductor devices are shrunk, the process flow that makes these devices becomes more dependent on the relative planarization of the layers of material used to form the semiconductor devices. For example, the process capability of a photolithographic or etch process is directly proportional to the topography of the underlying layers.

The requirement for planar surfaces during the process flow has motivated the development of Chemical Mechanical Polishing (CMP) techniques. In general, CMP processes grind smooth the surface of a layer using a rotating pad in combination with an abrasive slurry solution. Ideally, as pressure is applied to the rotating pad, the highest portions of the surface of a semiconductor substrate will be removed. This process can be continued until the entire surface is relatively planar.

This technique, however, is not perfect. Due to process variations, not all portions of a semiconductor layer are planarized equally and the surface is not uniformly planar. It is well known in the art that small isolated structures can be removed faster than large, dense topography patterns. As a result, the differences in pattern density can lead to localized variations in polish rate and consequently variations in the topography.

To quantify these polish rate variations, the transition length, sometimes referred to as the pad relaxation distance, is measured. The pad relaxation distance is a function of the speed of rotation of the pad relative to the wafer, the force applied to the wafer by the pad, the composition of the pad, the life of the pad, and other factors. Local variations in the planarity of the substrate after the polishing process is complete are characterized by gradual changes in thickness across the substrate. These variations are a function of the pad relaxation distance.

A first prior method for improving the planarity of a CMP process reduces the pressure applied to the wafer by the polishing pad. By reducing the applied pressure, the polishing pad is not able to conform as strongly to the topography of the wafer and the pad relaxation distance is improved. This technique, however, reduces the throughput of the manufacturing process since a slower polishing rate is used.

A second prior method for improving the planarity of a film exposes and removes the portion of the film in the periphery of the wafer. This has been traditionally done by using a photolithographic mask to expose all portions of the semiconductor substrate including the edge of the wafer. In doing so, the large, dense portions of the topography are removed along the edge of the wafer by a subsequent etch process rather than by the polishing process. Due to the additional time used by a photolithographic system to expose the periphery of a wafer, this second method reduces the throughput of the photolithographic process by 20 percent to 50 percent. The actual impact on throughput is determined by the size of the semiconductor wafer and the ratio of internal dice to edge dice.

By now it should be appreciated that it would be advantageous to provide a method for improving the uniformity of a polishing process, especially near the edge dice of a semiconductor substrate. It would be of further advantage if the method also improved the throughput of the planarization process when compared to the above mentioned previously known methods.

BRIEF DESCRIPTION OF THE DRAWINGS

FIGS. 1-2 are enlarged cross-sectional views demonstrating a prior method for polishing semiconductor substrates;

FIG. 3 is an enlarged cross-sectional view showing an embodiment of the present invention;

DETAILED DESCRIPTION OF THE DRAWINGS

Figure 4:
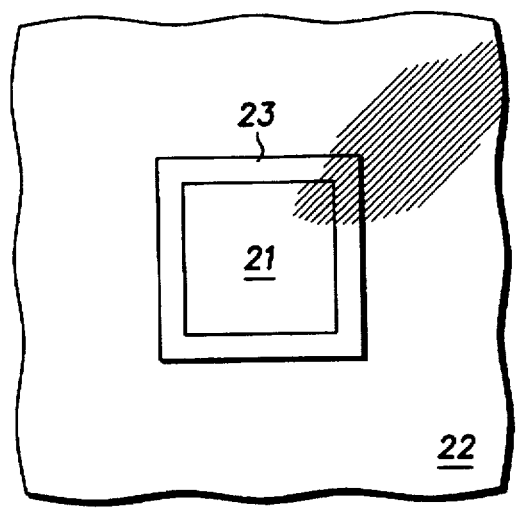
FIG. 4 is an enlarged top view of a photolithographic mask according to the present invention.

FIGS. 1-2 show the problem associated with polishing layers used to form a semiconductor device. FIG. 1 is an enlarged cross-sectional view of a semiconductor substrate 10 that has a first layer of material 11 on its surface. As shown in FIG. 1, first layer of material 11 has three patterns 15, 16, and 17. The first pattern 15 represents an isolated small metal line typically used to transport signals within the semiconductor device. Second pattern 16 is typical of the repeating geometries used to form electrical buses within the semiconductor device, and third pattern 17 represents the portion of first layer of material 11 that is along the edge of semiconductor substrate 10 in the periphery. To electrically isolate first layer of material 11 from future overlying layers, a dielectric layer or a second layer of material 12 is deposited on first layer of material 11.

As deposited, second layer of material 12 nearly follows the topography of first layer of material 11 and thus must be planarized to improve the process capability of photolithographic and etch processes to follow. To planarize first layer of material 11, a conventional chemical, mechanical, or combination chemical mechanical polish (CMP) process is used to remove the raised portions of second layer of material 12. FIG. 2 shows the resulting uniformity of the polishing process over the different portions of first layer of material 11. Over first pattern 15 and second pattern 16 the resulting planarity of second layer of material 12 is essentially smooth.

In contrast, however, the profile of second layer of material 12 near third pattern 17 is sloped and elevated. Due to the large raised area, the polish rate of third pattern 17 is slower than the polish rate of the topographies of first pattern 15 and second pattern 16. As a result, the periphery of semiconductor substrate 10 is not planar compared to the areas of first pattern 15 and second pattern 16. The slope in second layer of material 12 is referred to in the art as the relaxation distance and occurs over a lateral distance that is indicated in FIG. 2 as distance 13. Since the polishing pad cannot effectively planarize second layer of material 12 in this region, there is a resulting extra thickness in third pattern 17 shown as thickness 14.

The differential in thickness across second layer of material 12 will adversely affect the process capability of photolithographic and etch steps performed on second layer of material 12. This loss in process capability is a major contributor to the functional yield loss of semiconductor devices formed near the edge of semiconductor wafers. For example, an etch process used to form contact openings (not shown) through second layer of material 12, must be able to etch through the thicker portions of second layer of material 12, such as those near third pattern 17, without damaging underlying first layer of material 11 near the thinner portions of second layer of material 12, such as those near first pattern 15 and second pattern 16. Since the etch rate is typically constant across a wafer, contact openings will first be formed in the thinner portions of second layer of material 12 and take longer to form in the thicker portions of second layer of material 12. When contact openings are first completed in the thinner portions, they will expose underlying layers until the contact openings are completed in the thicker portions of second layer of material 12. Ideally, however, second layer of material 12 should be planar so as to allow a predictable and controllable etch process. This will minimize the exposure of underlying layers to potentially harmful etchants.

Therefore, to improve the process capability of subsequent photolithographic or etch steps, the profile of the planarized layer must be made uniform throughout all critical areas on a semiconductor wafer. The critical areas are where functional semiconductor devices are formed, including those near the edges of semiconductor wafers. As described below, one of the improvements of the present invention is that this thickened portion of the profile is either moved to a non-essential portion of the semiconductor wafer or is completely removed altogether. Turning now to FIG. 3, an improved method, according to the present invention, for planarizing a layer of material used to form semiconductor devices will be provided.

As shown in FIG. 3, a portion of first layer of material 11 is removed to form a moat or moat pattern 19. The portion of first layer of material 11 that provides moat pattern 19 is patterned and removed simultaneously along with the other portions of first layer of material 11. Moat pattern 19 is formed in the periphery of semiconductor substrate 10 and thus has no functional impact on the performance of a semiconductor device (not shown) formed on semiconductor substrate 10.

By removing a portion of first layer of material 11 in a non-critical area, the thickened portion of second layer of material 12 is moved away from the critical area by moving it closer towards the edge of semiconductor substrate 10. This movement is shown as distance 18 which indicates the lateral distance the thickened profile has moved compared to the previous profile shown in FIG. 2. The amount of movement is dependent on the exact polishing conditions, but is approximately equal to the width of moat pattern 19. As the width of moat pattern 19 is increased, the sloped profile, shown as distance 13, moves further into the periphery meaning closer to the edge of semiconductor substrate 10. Preferably, the width of moat pattern 19 is about 0.1 millimeters to 10 millimeters, and it should also be understood that the width of moat pattern 19 can be extended such that all of first layer of material 11, in the periphery of semiconductor substrate 10, is removed.

Figure 5:
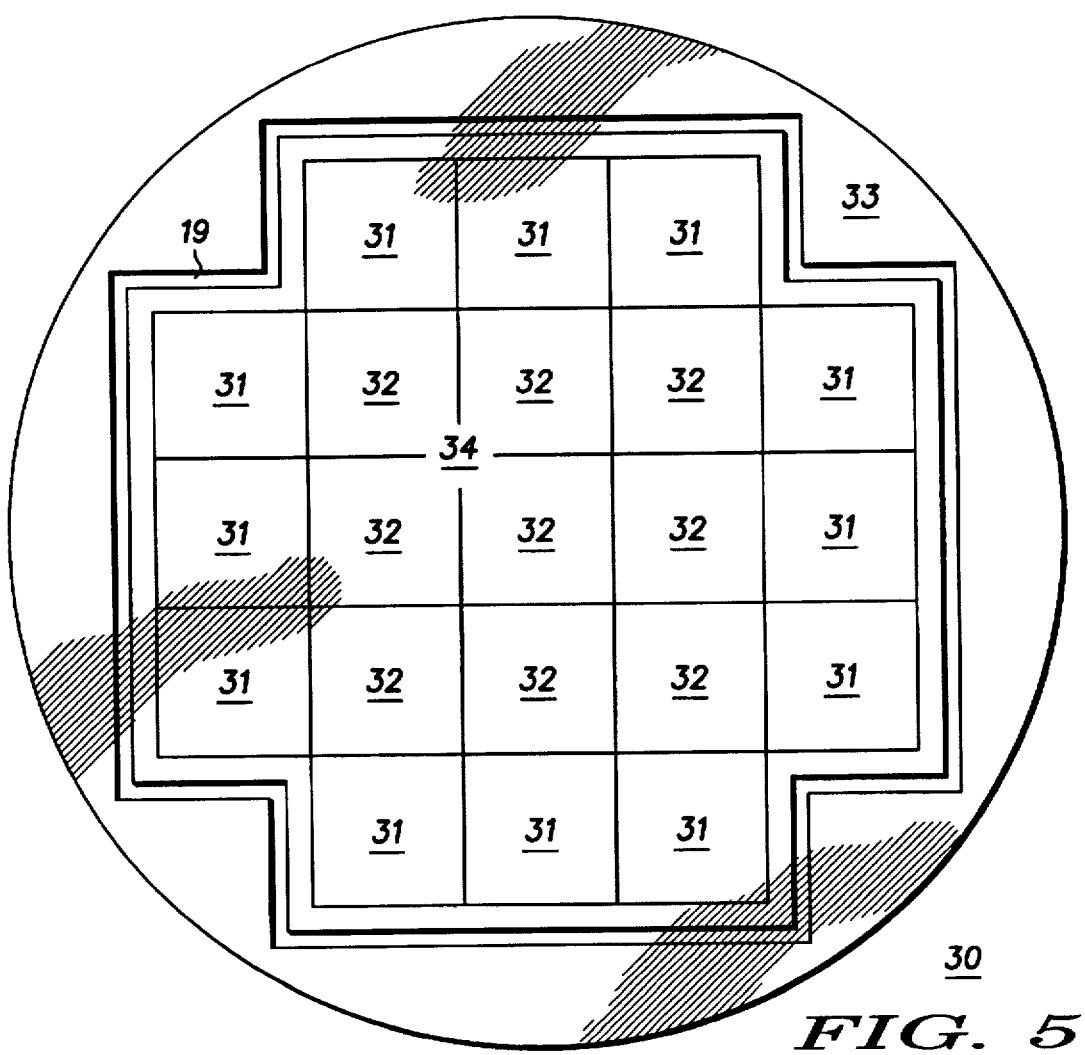
FIG. 5 is a top view of a semiconductor substrate according to the present invention.

A method for forming moat pattern 19 of the present invention will now be provided. FIG. 4 shows a photolithographic mask 20 that is used to form moat pattern 19 on a semiconductor substrate such as the one shown in FIG. 5. FIG. 5 shows a semiconductor substrate 30 that has a photo pattern across its surface. In brief, the present invention forms moat pattern 19 in the periphery of semiconductor substrate 30 as the photo pattern is exposed across semiconductor substrate 30. The critical area of semiconductor substrate 30 contains internal dice 32 that are bordered with edge dice 31. Moat pattern 19 is formed in sections as each of the edge dice 31 are exposed using a special photolithographic mask 20, shown in FIG. 4, in conjunction with a blading technique.

Photolithographic mask 20 comprises a first portion 21 that contains a pattern used to define semiconductor devices, which make up edge dice 31 and internal dice 32, and a second portion 22 that is used to form moat pattern 19. First portion 21 and second portion 22 are separated by a frame pattern 23. Frame pattern 23 is used in conjunction with the blades of an optical imaging system, commonly referred to as a stepper, to insure that moat pattern 19 is not formed in critical areas of a semiconductor wafer. Frame pattern 23 provides a buffer for any inaccuracies in the blading process since it is about 10 microns to 1000 microns wide. The width of frame pattern 23 determines how far moat pattern 19 begins from the edge of each edge die 31.

Turning to FIG. 5, a more detailed description of the blading process used to form moat pattern 19 on a semiconductor substrate 30 will be provided. Semiconductor substrate 30 can be any substrate commonly used in the industry and in the following example, has a layer of photoresist deposited over a first layer of material (not shown). Semiconductor substrate 30 has two regions, a first region 34 and a second region 33. First region 34 is the critical area of semiconductor substrate 30 where semiconductor devices are formed. As shown in FIG. 5, first region 34 has internal dice 32 that are surrounded by edge dice 31, edge dice 31 providing the boundary of first region 34. Second region 33 of semiconductor substrate 30 is the non-functional periphery region near the edge of semiconductor substrate 30 and is the area in which moat pattern 19 is formed.

The functional portions of internal dice 32 and edge dice 31 are identical and are defined by first portion 21 of photolithographic mask 20, shown in FIG. 4. To define internal dice 32, the blades of a photolithographic stepper are set so that only the first portion 21 of photolithographic mask 20 is transferred to the surface of semiconductor substrate 30 with each exposure.

When edge dice 31 are defined, sections of second portion 22 are also transferred to the surface of substrate 30 to form moat pattern 19. Preferably, a positive resist process is used and second portion 22 of photolithographic mask 20 is transparent. This will allow the area of second portion 22 that is exposed and transferred to the surface of substrate 30 to remove the underlying sections of the first layer of material during a subsequent etch process. For example, to expose the top right edge die 31, the blades of the photolithographic stepper are set so that first portion 21 will be transferred to provide the pattern for the semiconductor structures that make up edge dice 31. The blades are also set so that the bottom and left portions of second portion 22 of photolithographic mask 20 are not transferred to the surface. In addition, the blades are further set so the top and right portions of second portion 22 are transferred to the surface to provide these segments of moat pattern 19.

The amount of second portion 22 that the blades allow to be transferred to the surface determines the shape of moat pattern 19. The distance between the edge of the blades and the edge of frame pattern 23 is the width of moat pattern 19. This technique is adjusted to expose the proper segments of moat pattern 19 as each of the edge dice 31 are exposed. Note that the blades of the photolithographic stepper prevent any of second portion 22 from inappropriately overlapping internal dice 32 or edge dice 31. It should also be appreciated that the blades could be adjusted such that second portion 22 exposes essentially all of the periphery of semiconductor substrate 30.

In the above example, moat pattern 19 is provided by a clear portion on photolithographic mask 20 and the blades of a photolithographic stepper. It should also be understood that an optically equivalent could be accomplished by patterning photolithographic mask so that second portion 22 has a clear strip in a dark field which would not require the use of blades to define the edges of moat pattern 19. In this case, the width of moat pattern 19 would be the width of the strip and not depend on the placement of the blades.

Regardless of which embodiment is used, this process is used to form a photo pattern across semiconductor substrate 30 that is made up of internal dice 32 and edge dice 31. Moat pattern 19 is formed in the periphery of semiconductor substrate 30 in sections as each of the edge dice 31 are patterned into the layer of photoresist. The layer of photoresist is then developed using techniques known by those skilled in the art, and the underlying layer of material is etched using an appropriate etch process. A second layer of material (not shown in FIG. 5) is formed on the first layer of material and then planarized using any appropriate polishing process.

The formation of a moat pattern 19, or similar structure, to improve the uniformity of the planarization process can be used at any appropriate point in the process flow. For example, a moat pattern can be formed in a conductive layer to improve the planarity of the overlying dielectric layer used to provide inter-level electrical isolation. The dielectric layer can be a layer of phosphosilicate glass (PSG), low temperature oxide (LTO) or the like, which needs to be planarized to improve the process capability of the processes that follow. It should also be understood that moat pattern 19 can be formed in many other types of layers including the particular layer that is to be polished.

A significant advantage of the present invention is that it does not require the wasteful exposure of additional photolithographic patterns in the periphery. One previously known method for improving the planarity of a polishing process uses the photolithographic mask used to pattern the internal and edge dice to completely pattern the entire top surface of a semiconductor substrate. This requires additional time in the stepper to perform the exposure steps to transfer a pattern to the periphery of the semiconductor wafer. This additional time typically reduces the throughput of the stepper by 20 percent to 50 percent depending on the size of the photolithographic mask, the diameter of the wafer, and the surface area of the periphery. The present invention, however, does not require additional exposure steps since only the same number of exposures required to pattern edge dice 31 and internal dice 32 are necessary to form moat pattern 19. The present invention, therefore, can improve the throughput of the photolithographic process by 20 percent to 50 percent, which in turn, reduces the final manufacturing costs.

By now it should be appreciated that the present invention provides a photolithographic mask and a method for improving the uniformity of a planarization process. This method does not require any adjustments to the polishing process so there is no impact on the polishing rate. This allows the present invention to be utilized in conjunction with the most efficient polishing processes available. The present invention also offers an improvement in throughput and a reduction in manufacturing cost since it obviates the need for additional exposures during the photolithographic process. The formation of moat pattern 19 is incorporated into an existing process flow, and can be performed without any additional process steps.

We claim:

1. A method for forming semiconductor devices, the method comprising the steps of:

providing a semiconductor substrate having a first region and a second region, the first region comprising internal dice and edge dice and having a perimeter, the second region surrounding the perimeter of the first region;

disposing a first layer of material overlying the first region and the second region;

patterning the first layer of material to define a moat region overlying the second region and to leave a first portion of the first layer of material overlying the first region, and a second portion of the first layer of material overlying the second region, wherein the second portion lies between the moat region and the first portion;

disposing a second layer of material overlying the first portion, the second portion, and the moat region; and polishing the second layer of material.

2. The method of claim 1, wherein the step of disposing a first layer of material is further characterized as forming a conductive layer of material.

3. The method of claim 1, wherein the step of disposing a second layer of material is further characterized as forming a dielectric layer of material.

4. The method of claim 1, wherein the step of patterning the first layer of material the second portion is further characterized as being about 10 microns to 1000 microns wide.

5. The method of claim 1, wherein the step of patterning the first layer of material is further characterized as leaving a third portion of the first layer of material overlying the second region, wherein the moat region lies between the second portion and the third portion.

6. The method of claim 5, wherein the step of patterning the first layer of material the moat region is further characterized as being about 0.1 millimeters to 10 millimeters wide.

7. The method of claim 1, wherein the step of patterning the first layer of material the moat region is further characterized as surrounding the perimeter of the first region.

8. The method of claim 1, wherein the step of patterning the first layer of material comprises the steps of:

forming a layer of resist overlying the first layer of material; and patterning the layer of resist using a photolithographic mask that has a portion of the photolithographic mask blocked with a blading process.

* * * * *